(12) United States Patent
Karp et al.

(10) Patent No.: US 9,379,109 B1
(45) Date of Patent: Jun. 28, 2016

(54) INTEGRATED CIRCUIT HAVING IMPROVED RADIATION IMMUNITY

(75) Inventors: James Karp, Saratoga, CA (US);
Michael J. Hart, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 95 days.

(21) Appl. No.: 13/439,721

(22) Filed: Apr. 4, 2012

(51) Int. Cl.
*H01L 27/092* (2006.01)

(52) U.S. Cl.
CPC .................................... *H01L 27/092* (2013.01)

(58) Field of Classification Search
USPC ............. 257/204; 438/129, 199, 275; 365/69, 365/104
See application file for complete search history.

(56) References Cited

U.S. PATENT DOCUMENTS

| | | | |
|---|---|---|---|
| 4,476,479 A * | 10/1984 | Saito ............................. | 257/370 |
| 5,570,313 A | 10/1996 | Masson et al. | |
| 7,515,452 B1 | 4/2009 | de Jong et al. | |
| 7,638,822 B1 | 12/2009 | de Jong et al. | |
| 7,795,900 B1 | 9/2010 | Lesea et al. | |
| 2002/0181274 A1* | 12/2002 | Nii ....................... | G11C 11/412 365/154 |
| 2006/0056220 A1 | 3/2006 | Roche et al. | |
| 2006/0102960 A1* | 5/2006 | Masleid .......... | H01L 21/823878 257/371 |
| 2007/0080406 A1* | 4/2007 | Snyder et al. ................. | 257/369 |
| 2007/0241370 A1 | 10/2007 | Terada | |
| 2007/0267760 A1 | 11/2007 | Katsuki et al. | |
| 2009/0309144 A1* | 12/2009 | Park et al. ..................... | 257/292 |
| 2010/0238715 A1 | 9/2010 | Pedersen | |
| 2010/0264953 A1 | 10/2010 | Lilja | |
| 2010/0321098 A1* | 12/2010 | Koniaris et al. ............... | 327/534 |
| 2011/0049621 A1* | 3/2011 | Lotfi et al. .................... | 257/337 |

OTHER PUBLICATIONS

Hsieh, C.M., et al., *A field funneling effect on the collection of alpha-particle-generated carriers in silicon devices*, IEEE Electron Device Letters, vol. 2, EDL. 2, No. 4, pp. 103-105, Apr. 1981.
Ziegler, J.F. et al., *SER-History, Trends and Challengers, a guide for designing with Memory ICs*, Cypress Semiconductor, pp. 6-3-6-5, Chapter 6, 2004, US.
U.S. Appl. No. 13/439,706, filed Apr. 4, 2012, Hart, Michael J., et al.; Xilinx, Inc., 2100 Logic Drive, San Jose, CA USA.
U.S. Appl. No. 13/686,553, filed Nov. 27, 2012, Jain, Praful et al.; Xilinx, Inc., 2100 Logic Drive, San Jose, CA USA.
U.S. Appl. No. 13/587,823, filed Aug. 16, 2012, Hart, Michael J., et al.; Xilinx, Inc., 2100 Logic Drive, San Jose, CA USA.

\* cited by examiner

*Primary Examiner* — Kenneth Parker
*Assistant Examiner* — Lawrence-Linh T Nguyen
(74) *Attorney, Agent, or Firm* — John J. King

(57) ABSTRACT

An integrated circuit device having improved radiation immunity is described. The integrated circuit device comprises an n-type wafer having a first surface and a second surface; a p-type epitaxial layer formed on the first surface of the n-type wafer, the p-type epitaxial wafer having first elements storing charge; and an n-well formed in the p-type epitaxial layer, the n-well having second elements storing charge; wherein the n-type wafer is positively biased to attract excess minority carriers in the p-type epitaxial layer. A method of improving radiation immunity in an integrated circuit is also described.

14 Claims, 6 Drawing Sheets

FIG. 5-A
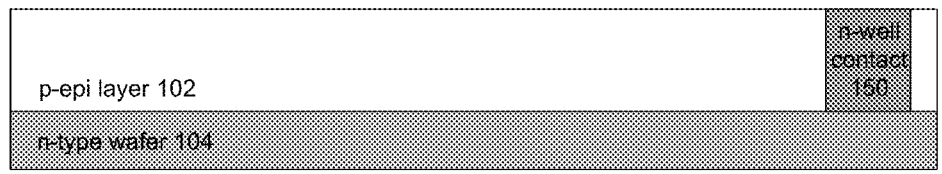
FIG. 5-B
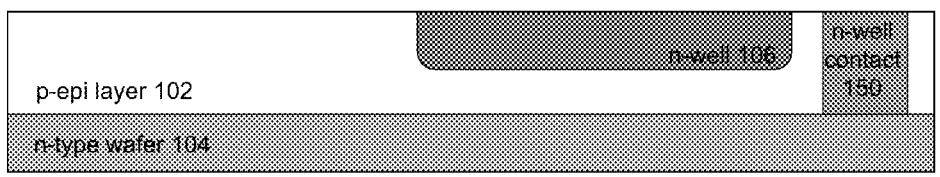
FIG. 5-C
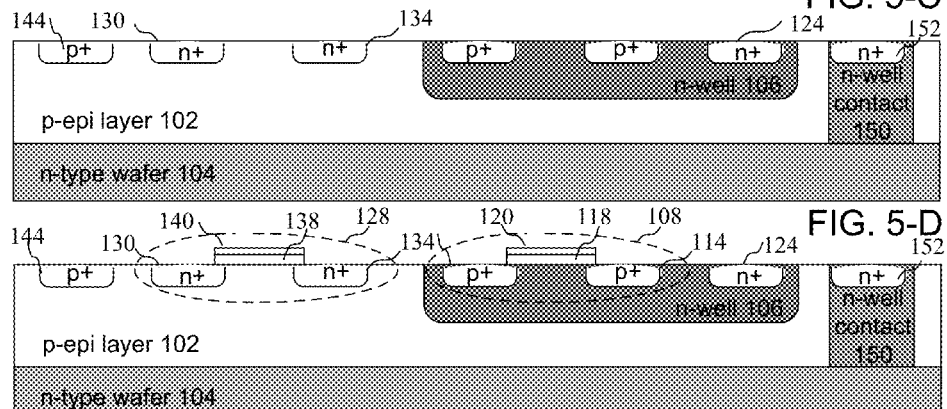
FIG. 5-D
FIG. 5-E
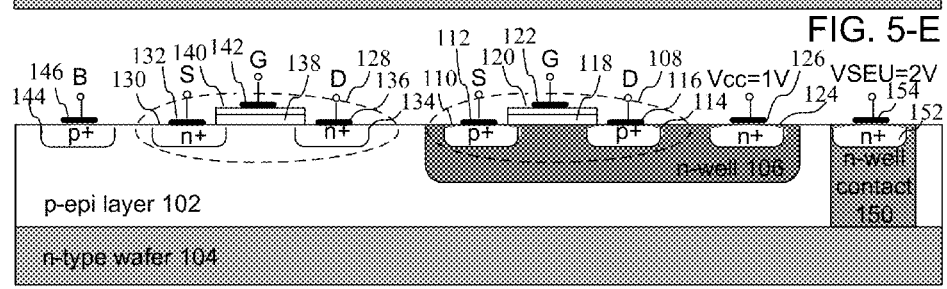
FIG. 5-F

US 9,379,109 B1

INTEGRATED CIRCUIT HAVING IMPROVED RADIATION IMMUNITY

FIELD OF THE INVENTION

An embodiment of the invention relates generally to integrated circuits, and in particular, to an integrated circuit having improved radiation immunity and to a method of improving radiation immunity in an integrated circuit.

BACKGROUND OF THE INVENTION

Memory cells are implemented in devices such as integrated circuit devices to store data. The data may be used during operation of the device or, in the case of programmable integrated circuits, to configure the integrated circuit to perform functions desired by the user of the device. However, for a variety of reasons, data may become corrupted. The corrupted data may impact the performance of the integrated circuit. In some instances, the corrupted data may render the integrated circuit unusable until the correct data is restored in the memory. While techniques exist to both detect and correct data errors without having to reload the entire memory, such techniques have significant limitations.

One way that data in a memory element may be corrupted is through a radiation impact, often called a single event upset (SEU) strike. Such a strike may change or "upset" data stored in a memory element. Conventional techniques to sink minority carriers generated during an SEU strike rely on a "buried layer" having a high recombination rate. However, experiments have shown that this layer leads to opposite result. That is, the SEU rate increases as highly doped buried P+ layer repels minority carriers, such as electrons in p-substrate. Accordingly, conventional methods of addressing the impact of an SEU strike have failed to prevent the undesirable loss of data.

SUMMARY OF THE INVENTION

An integrated circuit device having improved radiation immunity is described. The integrated circuit device comprises an n-type wafer having a first surface and a second surface; a p-type epitaxial layer formed on a first surface of the n-type wafer, the p-type epitaxial layer having first elements storing charge; and an n-well formed in the p-type epitaxial layer, the n-well having second elements storing charge; wherein the n-type wafer is positively biased to attract excess minority carriers in the p-type epitaxial layer.

The elements storing a positive charge may include n-type regions of an n-channel transistor, and the elements storing a negative charge may include p-type regions of a p-channel transistor. A source of the n-channel transistor may be coupled to ground, a source of the p-channel transistor may be coupled to a first reference voltage, and a drain of the n-channel transistor may be coupled to a drain of the p-channel transistor. The p-type epitaxial layer may comprise a p-type region coupled to ground. The n-well formed in the p-type epitaxial layer may comprise an n-type region coupled to a first reference voltage. The integrated circuit device may comprise a deep n-well contact coupled to the first surface of the n-type wafer, and may be coupled to a second reference voltage.

According to an alternate embodiment, an integrated circuit device having improved radiation immunity comprises an n-type wafer having a first surface and a second surface, wherein the n-type wafer is positively biased; a p-type epitaxial layer formed on a first surface of the n-type wafer, the p-type epitaxial layer having elements of an n-channel transistor; and an n-well formed in the p-type epitaxial layer, the n-well having elements of a p-channel transistor, wherein the n-channel transistor and the p-channel transistor are coupled to form a CMOS transistor pair.

The integrated circuit device may further comprise a p-type region in the p-type epitaxial layer, wherein the p-type region is coupled to ground. The integrated circuit device may also comprise an n-type region in the n-well, wherein the n-type region is coupled to a reference voltage. The integrated circuit device of claim 8 may also comprise a first p-n junction between the p-type epitaxial layer and the n-well, and a second p-n junction between the p-type epitaxial layer and the n-type wafer. The integrated circuit device may further comprise a deep n-well contact extending from the top of the p-type epitaxial layer to the first surface of the n-type wafer, wherein the n-type wafer is positively biased by the n-well contact. Alternatively, the n-type wafer may be negatively biased by way of the second surface of the n-type wafer.

A method of improving radiation immunity of an integrated circuit is also described. The method comprises forming a p-type epitaxial layer on a first surface of an n-type wafer, the p-type epitaxial layer having first elements storing charge; and forming an n-well formed in the p-type epitaxial layer, the n-well having second elements storing charge; positively biasing the n-type wafer; and dissipating excess negative charge in the p-type epitaxial layer to the n-type wafer.

Dissipating excess negative charge may comprise dissipating the excess negative charge by way of a first p-n junction between the p-type epitaxial layer and the n-well. Dissipating excess negative charge may also comprise dissipating the excess negative charge by way of a second p-n junction between the p-type epitaxial layer and the n-type wafer. Forming the first elements storing charge and forming the second elements storing charge may comprise forming a CMOS pair. The method may further comprise forming a deep n-well contact to the first surface of the n-type wafer, wherein positively biasing the n-type wafer is achieved by way of the deep n-well contact. Alternatively, positively biasing the n-type wafer may be achieved by way of the second side of the n-type wafer.

BRIEF DESCRIPTION OF THE DRAWINGS

FIG. 5 is a series of cross-sectional views showing the formation of the charge storage elements of FIG. 1 according to an embodiment;

DETAILED DESCRIPTION OF THE DRAWINGS

Figure 1:
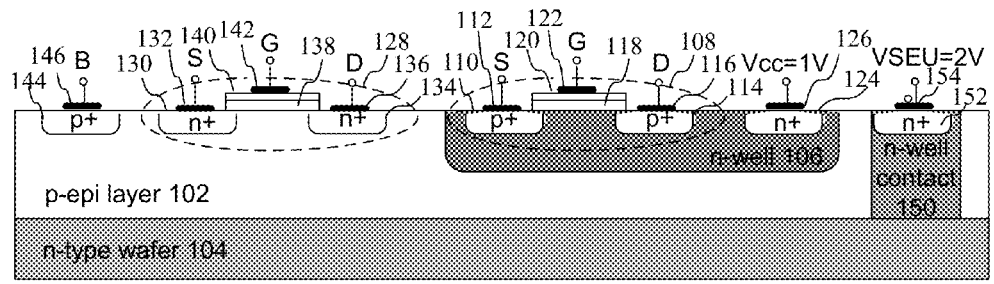
FIG. 1 is a cross-sectional view of an integrated circuit having charge storage elements according to an embodiment.

Turning now to FIG. 1, a cross-sectional view of an integrated circuit having charge storage elements is shown. The integrated circuit of FIG. 1 provides an efficient and low cost solution to improve SEU immunity compared to conventional CMOS technology. As will be described in more detail below, by processing CMOS on p-type epitaxial layer (p-epi) layer grown on top of an n-type wafer (rather than using p-epi on p-type wafer) and by reverse biasing p-n junction between p-epi layer and the n-type wafer, the effects of an SEU strike can be significantly reduced. More particularly, reversed biased buried p-n junction creates additional effective sink of minority carriers generated during SEU strike in the p-epi layer without increasing the die size.

Referring specifically to FIG. 1, memory elements, such as memory elements of CMOS devices, are formed using a p-epi layer 102 grown on an n-type wafer 104 such as, e.g., an n-type silicon wafer. An n-well 106 is also formed, such as by a diffusion or ion implantation process, in the p-epi layer 102. A memory element 108 comprises a first p-type region 110 formed in the n-well 106 and having a source contact 112, and a second p-type region 114 having a drain contact 116. The first p-type region 110 and the second p-type region 114 are designated as "p+" for having a higher positive carrier (i.e. hole) concentration than the region in which it is formed, while other regions are designated with an "n+" for having a higher negative carrier (i.e. electron) concentration than the region in which it is formed. An oxide layer 118, a gate 120 and a gate contact 122 are applied over the first p-type region 110, the second p-type region 114, and the channel region between the first p-type region 110 and the second p-type region 114 to form the p-type transistor 108. An "n-tap" region 124 is also formed in the n-well 106. As will be described in more detail in reference to FIG. 3, a contact 126 associated with the n-tap 124 is coupled to a positive voltage to attract undesirable negative carriers, such as positive carriers created by an SEU strike, and prevent the undesirable positive carriers from changing a logical "0" value stored on the source (S) node of the transistor 108.

A memory element 128 comprises a first n-type region 130 formed in the p-epi layer 104 and having a source contact 132, and a second n-type region 134 having a drain contact 136. An oxide layer 138, a gate 140 and a gate contact 142 are applied over the first n-type region 130 and the second n-type region 134, and the channel region between the first n-type region 130 and the second n-type region 134 to form an n-type transistor. An "p-tap" region 144 is also formed as a p-well in the p-epi layer 104. As will be described in more detail in reference to FIGS. 2 and 3, a contact 146 associated with the p-tap 144 is coupled to a body (B) voltage to attract undesirable positive carriers, such as positive carriers created by an SEU strike, and prevent the undesirable positive carriers from changing a negative value stored on the drain (D) node of the transistor 128. The body voltage B may be ground or a negative voltage, for example. As will be described in more detail in reference to FIG. 6, the drains of p-type transistor 108 and the n-type transistor 128 may be coupled together to form a CMOS pair, the output of which is the value at the drains of the p-type transistor 108 and the n-type transistor 128.

In order for the n-type wafer 104 to attract the undesirable negative carriers which may result from an SEU strike, p-n junction between p-epi layer 102 and n-wafer 104 must be reverse biased, where a greater reverse biasing will provide more effective SEU immunity. The biasing may be provided by the use of ohmic contacts to n-wafer, for example. According to one embodiment, a deep n-well contact 150 may be provided to create a contact to the n-type wafer 104 from the "active" side of the wafer by way of a n-type region 152 and a contact 154, as shown in FIG. 1. An SEU voltage (VSEU) of 2 volts provides the necessary positive bias to attract negative carriers to the n-type wafer 104. Because the n-well contacts 150 may be located in areas not otherwise occupied by circuits, such as h-clock rows as will be described in more detail in reference to FIG. 9, the memory cell of FIG. 1 can provide improved radiation immunity without occupying any additional area. According to an alternate embodiment, the contact 154 may be placed on the "non-active" side (i.e. the bottom of the n-type wafer 104 as shown).

Figure 2:
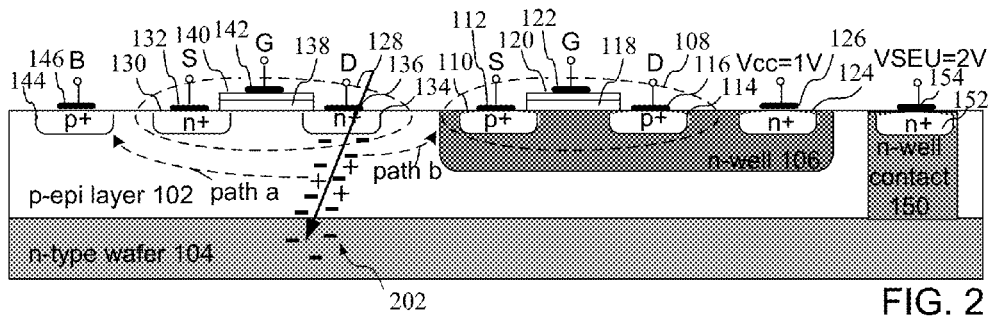
FIG. 2 is a cross-sectional view of the integrated circuit of FIG. 1 showing a radiation impact at a first node according to an embodiment.
Figure 3:
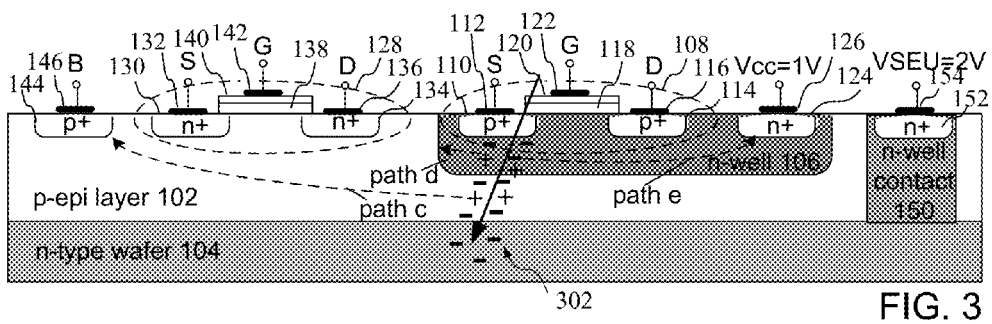
FIG. 3 is a cross-sectional view of the integrated circuit of FIG. 1 showing a radiation impact at a second node according to an embodiment.

Turning now to FIGS. 2 and 3, examples of SEU strikes are provided to show the various paths for dissipating excess charge according to the embodiment of FIG. 1. FIG. 2 shows an SEU strike on the drain contact 136, while FIG. 3 shows an SEU strike on source contact 112. During an SEU strike, electrons and holes are generated as shown by the solid arrows in FIGS. 2 and 3. Majority carriers (i.e. holes in p-epi layer 102 and electrons in n-well 106) generated during an SEU strike are collected by well taps. More particularly, positive carriers (designated by the + symbols) in the p-epi layer 102 are attracted to the p-tap 144 (coupled to ground or a negative voltage) as shown by the dashed arrow designating "path a" of FIG. 2 and "path c" of FIG. 3. Similarly, negative carriers in the n-well 106 are attracted to the positively biased n-tap 124 as shown by the dashed arrow designating "path e" of FIG. 3.

Minority carriers generated during a strike, which may cause a logical value stored in a memory element, are collected by reverse biased junctions. In the n-well 106, the reversed bias junctions are the wall of the n-well and junction of the critical node (i.e. the source of the p-channel transistor 108) that holds the stored logical "0" information. Accordingly, the minority positive carriers in the n-well are attracted to the wall of the n-well as shown by the dashed arrow representing "path d" in FIG. 3. In the p-epi layer 102, reverse biased junctions are by formed walls of the n-well and junction of the critical node (the drain of the channel transistor 128) that hold the stored logical "1" information. Accordingly, negative carriers are attracted to the n-well as shown by the dashed arrow of "path b." However, the positive bias of n-type wafer 102 by way of the n-well contact 150 also attracts negative carriers as shown at the junction between p-epi layer 102 and the n-type wafer 104, preventing these minority carriers from "flipping" a positive value stored as a logical "1" on the drain of the transistor 128. While the reverse biased junction between p-epi layer 102 and the n-type wafer 104 is particularly useful in attracting minority carriers in the p-epi layer 102 as shown in FIG. 2, this reverse biased junction supplements the attraction of negative carriers generated by the SEU strike in the n-well 106 to the positively biased n-tap 124.

While the efficiency of the circuit of FIG. 1 is believed to be similar to silicon-on-insulator (SOI) memory cell arrangements because there are no minority carriers generated beneath the epi-wafer interface, it is better than SOI arrangements because an SOI substrate does not sink minority carriers from p-epi layer, as is done in the buried reverse-biased junction of FIG. 1.

Figure 4:
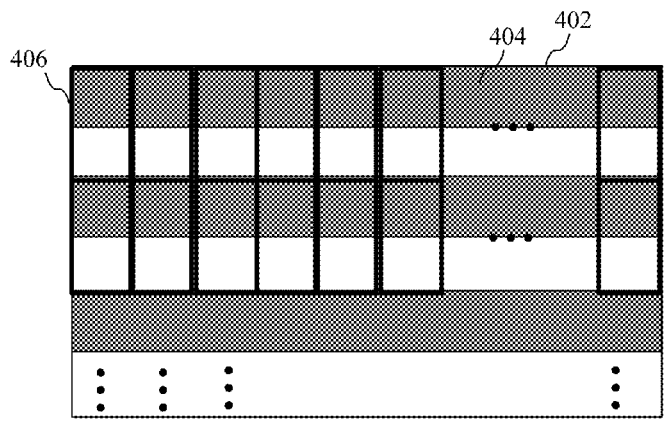
FIG. 4 is a top plan view showing an arrangement of charge storage elements of the integrated circuit of FIG. 1 according to an embodiment.

Turning now to FIG. 4, a top plan view shows an arrangement of charge storage elements of a portion 402 of the integrated circuit of FIG. 1. As will be described in more detail below in reference to FIG. 9, the SRAM cells could be a part of a block of random access memory (BRAM), or other memory cells of the integrated circuit of FIG. 9. As shown in FIG. 4, n-wells formed in strips 404 extending along a corresponding area of the p-epi layer. CMOS pairs 406, such as a pair of transistors 108 and 128 as shown in FIG. 1 and designated by the black boxes in FIG. 4, are arranged in a matrix in the portion 402 of the integrated circuit.

Turning now to FIG. 5, a series of cross-sectional views show the formation of the charge storage elements of FIG. 1 according to an embodiment. A p-epi layer 104 is formed on the n-type wafer 102, as shown in FIG. 5-A. The deep, n-well contact 150 is then formed in the p-epi layer 104, as shown in FIG. 5-B. The shallow n-well contact 106 is then formed in the p-epi layer 104, as shown in FIG. 5-C. While the deep N-well contact 150 is shown being formed first, it should be understood that the n-well 106 could be formed before the deep, N-well contact 106. The p+ or n+ regions of the transistors 108 and 128 are then formed in the p-epi layer 104, the n-well 106 and the n-well contact 150, as shown in FIG. 5-D. The gate and contact elements for the transistors are then formed on the top of the p-epi layer 104. In particular, the gate oxide layers 118 and 138, and the gates 120 and 140 are formed, as shown in FIG. 5-E, while the various contacts to the sources, gates, and drains are formed, as shown in FIG. 5-F.

Figure 6:
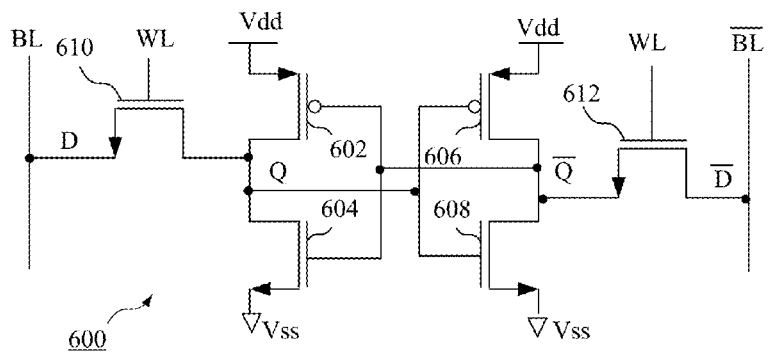
FIG. 6 is a block diagram of a memory element according to an embodiment.

Turning now to FIG. 6, a block diagram of a memory cell is shown. The memory cell includes an inverter having a p-channel transistor 602 with a source coupled to a reference voltage, such as Vdd, and a drain coupled at a first node "Q" to a drain of an n-channel transistor 604, the source of which is coupled to a ground potential (Vss). The memory cell includes a second inverter having a p-channel transistor 606 with a source coupled to the reference voltage and a drain coupled at a second node "Q-bar" to a drain of an n-channel transistor 608, the source of which is also coupled to ground. The first node "Q" is controlled by an n-channel transistor 610 coupled to receive a word line (WL) signal at its gate which controls the receipt of input data on a bit line (BL) at the first node. The second node "Q-bar" is controlled by another n-channel transistor 612 coupled to receive the word line signal at its gate which controls the receipt of inverted input data at the second node. While the memory cell of FIG. 6 is shown by way of example, other memory cells could be employed. Depending upon the dimensions of the transistors of a memory, and particularly the gate widths of the transistors of a memory, a particle associated with cosmic radiation may affect a number of transistors. By negatively biasing the n-type wafer 104, a loss of data can be significantly reduced.

Figure 7:
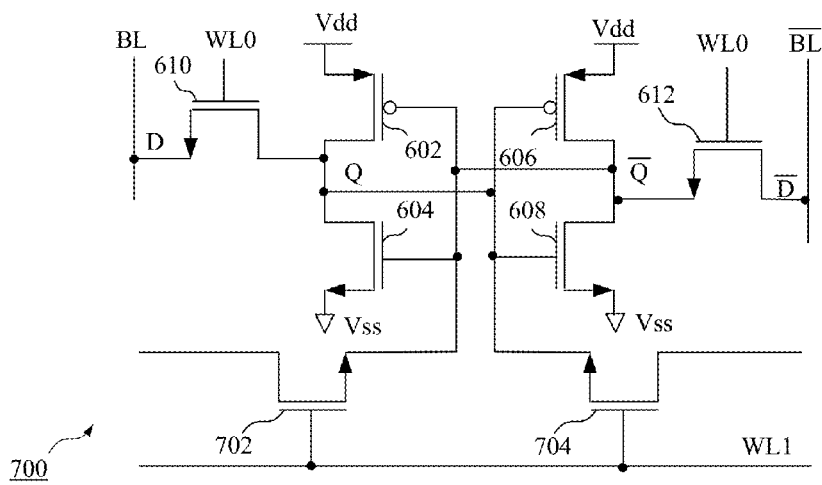
FIG. 7 is a block diagram of a memory element according to an alternate embodiment.

While the embodiment of FIG. 6 represents a "6T cell," the circuit of FIG. 7 represents an "8T cell." In particular, the transistors 702 and 704 are configured to enable separate word lines WL0 and WL1. The transistors 702 and 704 are configured as shown to have the source coupled to the Q and Qbar nodes as shown, where the gates are each controlled by the WL1. The transistors 108 and 128 of FIG. 1 may be configured as CMOS transistor pairs with their drains coupled together as shown in FIGS. 6 and 7 to provide 6T cells and 8T cells, respectively, having improved radiation immunity.

Figure 8:
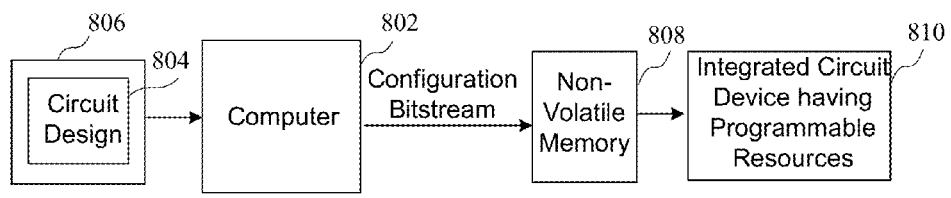
FIG. 8 is a block diagram of a system for programming a device having programmable resources according to an embodiment.

Turning now to FIG. 8, a block diagram of a system for programming a device having programmable resources is shown. In particular, a computer 802 is coupled to receive a circuit design 804 from a memory 806, and generate a configuration bitstream which is stored in the non-volatile memory 806. As will be described in more detail below, the circuit design may be a high level design, such as a circuit design defined in a hardware description language (HDL). Also, the computer may be configured to run software that generates a configuration bitstream which is stored in the non-volatile memory 806.

The software flow for a circuit design to be implemented in a programmable integrated circuit comprises synthesis, packing, placement and routing, as is well known in the art. Synthesis comprises the step of converting a circuit design in a high level design to a configuration of elements found in the programmable integrated circuit. For example, a synthesis tool operated by the computer 502 may implement the portions of a circuit design implementing certain functions in configurable logic blocks (CLBs) or digital signal processing (DSP) blocks, for example. An example of a synthesis tool is the ISE tool available from Xilinx, Inc. of San Jose Calif. Packing comprises the step of grouping portions of the circuit design into defined blocks of the device, such as CLBs. Placing comprises the step of determining the location of the blocks of the device defined during the packing step. Finally, routing comprises selecting paths of interconnect elements, such as programmable interconnects, in a programmable integrated circuit. At the end of place and route, all functions, positions and connections are known, and a configuration bitstream is then created. The bitstream may be created by a software module called BitGen, available from Xilinx, Inc. of San Jose, Calif. The bitstream is either downloaded by way of a cable or programmed into an EPROM for delivery to the programmable integrated circuit.

Figure 9:
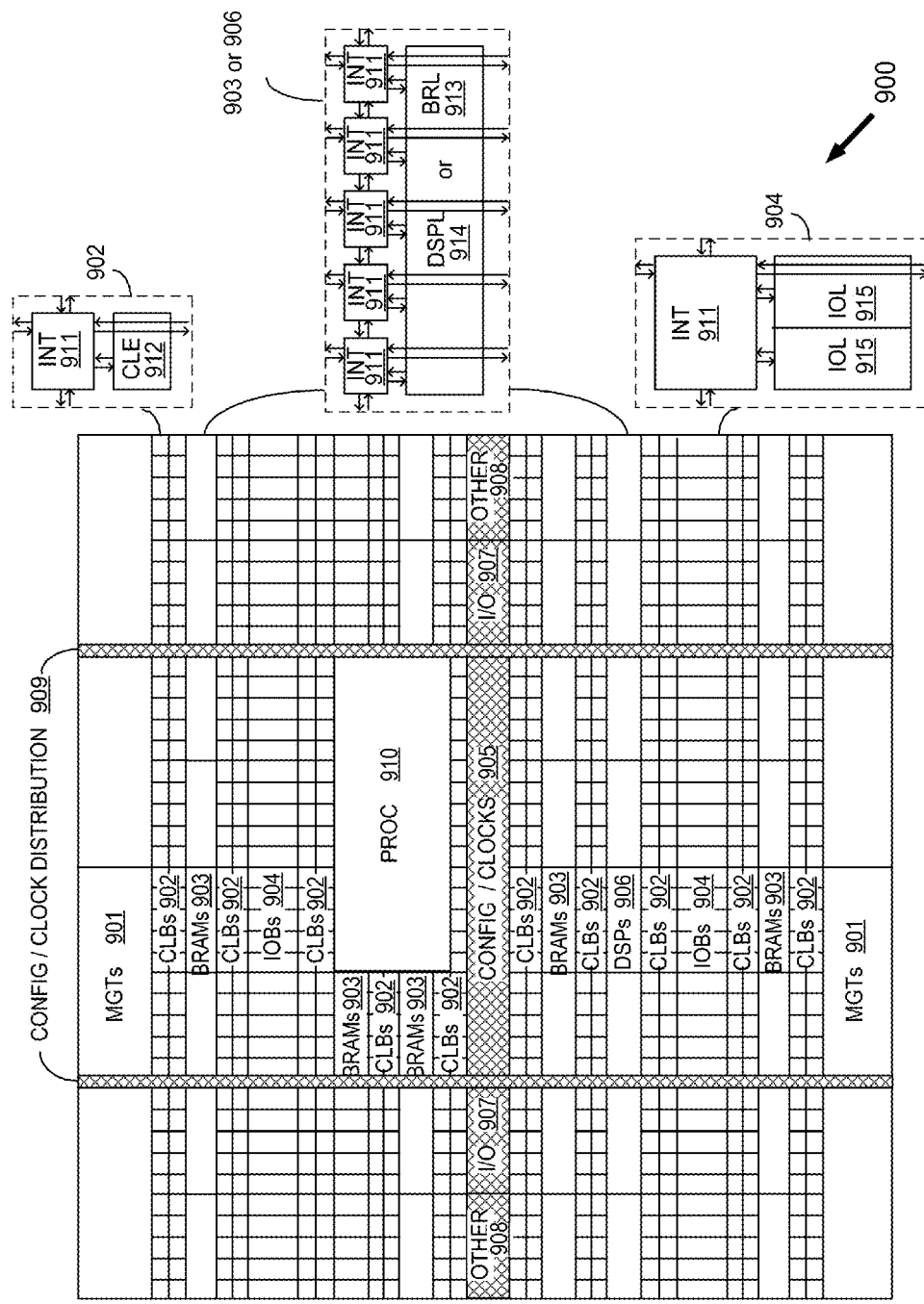
FIG. 9 is a block diagram of a device having programmable resources including memory elements according to FIG. 1.

Turning now to FIG. 9, a block diagram of a programmable integrated circuit device having programmable resources according to an embodiment is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 9 comprises an FPGA architecture 900 having a large number of different programmable tiles including multi-gigabit transceivers (MGTs) 901, CLBs 902, random access memory blocks (BRAMs) 903, input/output blocks (IOBs) 904, configuration and clocking logic (CONFIG/CLOCKS) 905, digital signal processing blocks (DSPs) 906, specialized input/output blocks (I/O) 907 (e.g., configuration ports and clock ports), and other programmable logic 908 such as digital clock managers, analog-to-digital converters, system monitoring logic, and so forth. Some FPGAs also include dedicated processor blocks (PROC) 910, which may be used to implement a software application, for example.

In some FPGAs, each programmable tile includes a programmable interconnect element (INT) 911 having standardized connections to and from a corresponding interconnect element in each adjacent tile. Therefore, the programmable interconnect elements taken together implement the programmable interconnect structure for the illustrated FPGA. The programmable interconnect element 911 also includes the connections to and from the programmable logic element within the same tile, as shown by the examples included at the top of FIG. 9.

For example, a CLB 902 may include a configurable logic element (CLE) 912 that may be programmed to implement user logic plus a single programmable interconnect element 911. A BRAM 903 may include a BRAM logic element (BRL) 913 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 906 may include a DSP logic element (DSPL) 914 in addition to an appropriate number of programmable interconnect elements. An IOB 904 may include, for example, two instances of an input/output logic element (IOL) 915 in addition to one instance of the programmable interconnect element 911. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. Horizontal areas 909 extending from this column are used to distribute the clocks and configuration signals across the breadth of the FPGA. The columnar area near the center of the die and the horizontal areas 909 may be used for implementing the deep, n-well contacts 150. That is, excess space in the center of the die and the horizontal areas 909 can be used to provide the n-well contacts to provide the necessary positive biasing of the n-type wafer 104. Some FPGAs utilizing the architecture illustrated in FIG. 9 include additional logic blocks that disrupt the regular columnar structure making up a large part of the FPGA. The additional logic blocks may be programmable blocks and/or dedicated logic. For example, the processor block PROC 910 shown in FIG. 9 spans several columns of CLBs and BRAMs.

Note that FIG. 9 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual FPGA more than one adjacent column of CLBs is typically included wherever the CLBs appear in order to facilitate the efficient implementation of user logic. While the embodiment of FIG. 9 relates to an integrated circuit having programmable resources, it should be understood that the circuits and methods set forth in more detail below could be implemented in any type of ASIC.

Figure 10:
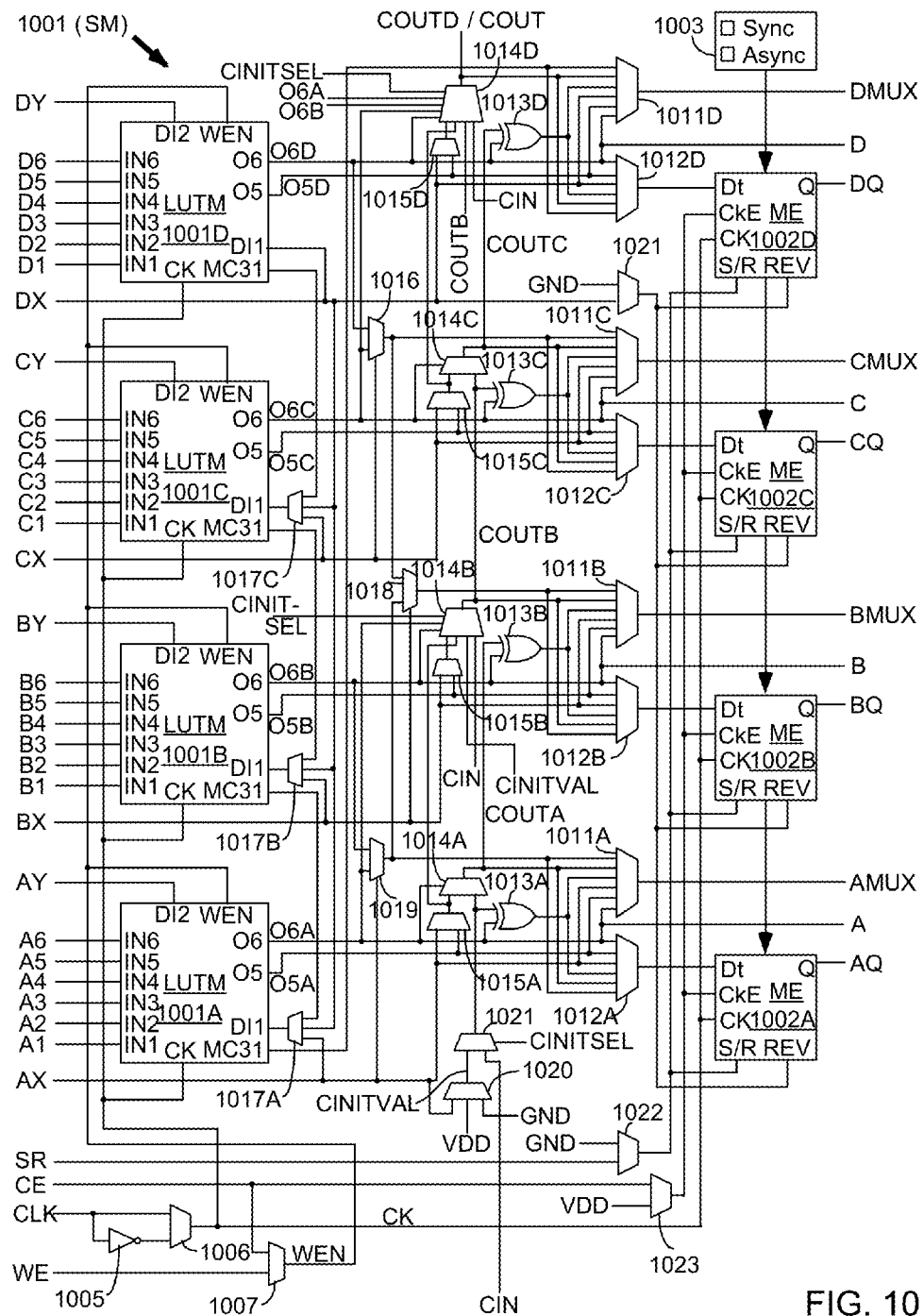
FIG. 10 is block diagram of a configurable logic element of the device of FIG. 9 according to an embodiment.

Turning now to FIG. 10, a block diagram of a configurable logic element according to an embodiment is shown. In particular, FIG. 10 illustrates in simplified form a configurable logic element of a configuration logic block 902 of FIG. 9. In the embodiment of FIG. 10, slice M 1001 includes four lookup tables (LUTMs) 1001A-1001D, each driven by six LUT data input terminals A1-A6, B1-B6, C1-C6, and D1-D6 and each providing two LUT output signals O5 and O6. The O6 output terminals from LUTs 1001A-1001D drive slice output terminals A-D, respectively. The LUT data input signals are supplied by the FPGA interconnect structure via input multiplexers, which may be implemented by programmable interconnect element 1011, and the LUT output signals are also supplied to the interconnect structure. Slice M also includes: output select multiplexers 1011A-1011D driving output terminals AMUX-DMUX; multiplexers 1012A-1012D driving the data input terminals of memory elements 1002A-1002D; combinational multiplexers 1016, 1018, and 1019; bounce multiplexer circuits 1022-1023; a circuit represented by inverter 1005 and multiplexer 1006 (which together provide an optional inversion on the input clock path); and carry logic having multiplexers 1014A-1014D, 1015A-1015D, 1020-1021 and exclusive OR gates 1013A-1013D. All of these elements are coupled together as shown in FIG. 10. Where select inputs are not shown for the multiplexers illustrated in FIG. 10, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 10 for clarity, as well as from other selected figures herein.

In the pictured embodiment, each memory element 1002A-1002D may be programmed to function as a synchronous or asynchronous flip-flop or latch. The selection between synchronous and asynchronous functionality is made for all four memory elements in a slice by programming Sync/Asynch selection circuit 1003. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1002A-1002D are clocked by a clock signal CK, which may be provided by a global clock network or by the interconnect structure, for example. Such programmable memory elements are well known in the art of FPGA design. Each memory element 1002A-1002D provides a registered output signal AQ-DQ to the interconnect structure. Because each LUT 1001A-1001D provides two output signals, O5 and O6, the LUT may be configured to function as two 5-input LUTs with five shared input signals (IN1-IN5), or as one 6-input LUT having input signals IN1-IN6.

In the embodiment of FIG. 10, each LUTM 1001A-1001D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1017A-1017C for LUTs 1001A-1001C), or to the two 32-bit RAMs via input terminals DI1 and DI2. RAM write operations in the LUT RAMs are controlled by clock signal CK from multiplexer 1006 and by write enable signal WEN from multiplexer 1007, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1001A may also be provided to the general interconnect structure for shift register chaining, via output select multiplexer 1011D and CLE output terminal DMUX. Accordingly, the circuits and methods set forth above may be implemented in a device such as the devices of FIGS. 9 and 10, or any other suitable device.

Figure 11:
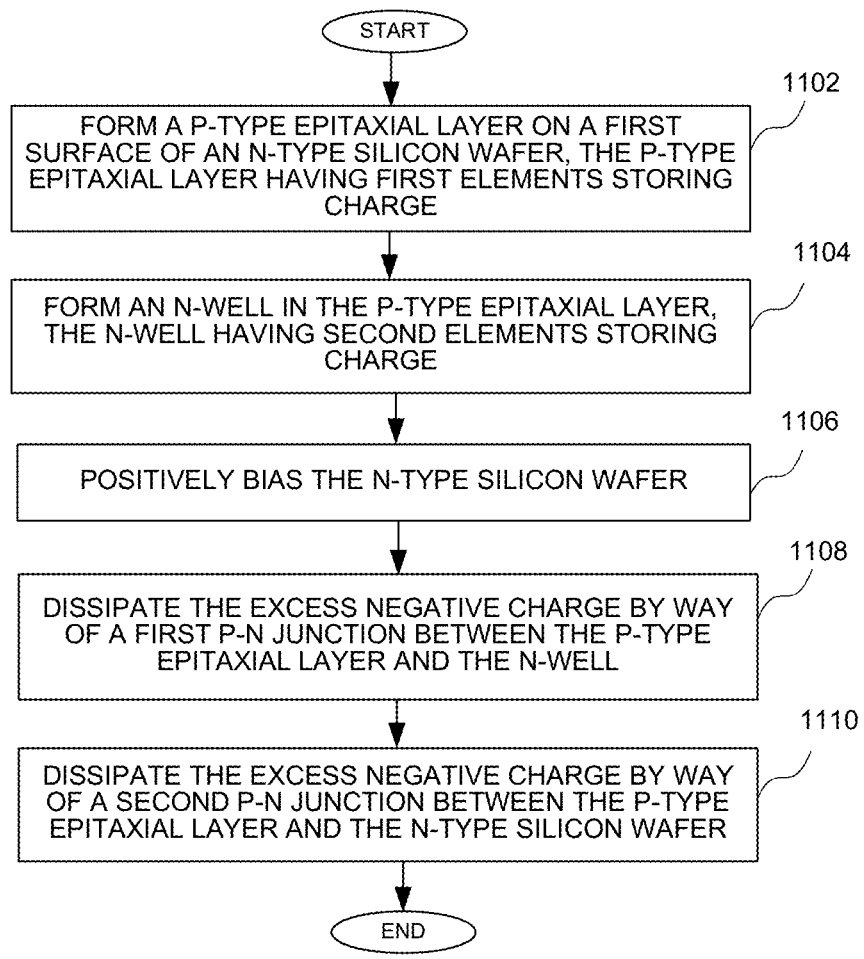
FIG. 11 is a flow chart showing a method of improving radiation immunity in an integrated circuit according to an embodiment.

Turning now to FIG. 11 a flow chart shows a method of improving radiation immunity in an integrated circuit. In particular, a p-type epitaxial layer is formed on a first surface of an n-type silicon wafer, the p-type epitaxial layer having first elements storing charge at a step 1102. An n-well is formed in the p-type epitaxial layer, the n-well having second elements storing charge at a step 1104. The n-type silicon wafer is positively biased at a step 1106. The excess negative charge is dissipated by way of a first p-n junction between the p-type epitaxial layer and the n-well at a step 1108. The excess negative charge is dissipated by way of a second p-n junction between the p-type epitaxial layer and the n-type silicon wafer at a step 1110. The method of FIG. 11 can be implemented using any of the embodiments of FIGS. 1-10 as described, or any other suitable circuits.

It can therefore be appreciated that the new and integrated circuit device having improved radiation immunity and method of improving radiation immunity in an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. An integrated circuit device having improved radiation immunity, comprising:
   an n-type die from an n-type wafer having a first surface and a second surface;
   a p-type epitaxial layer formed on the first surface of the n-type die, the p-type epitaxial layer having first elements storing charge and a p-tap, wherein the p-tap is coupled to a contact configured to receive a ground voltage or a negative voltage;
   an n-well formed in the p-type epitaxial layer, the n-well having second elements storing charge and an n-type region; and
   a deep n-well contact coupled to the first surface of the n-type die;
   wherein the deep n-well contact is coupled to a first positive voltage contact configured to receive a positive voltage;
   wherein the n-type region of the n-well is coupled to a second positive voltage contact configured to receive a positive voltage; and
   wherein the n-well and the p-type epitaxial layer form a first p-n junction to attract excess minority carriers in the p-type epitaxial layer, and the n-type die and the p-type epitaxial layer form a second p-n junction to attract excess minority carriers in the p-type epitaxial layer.

2. The integrated circuit device of claim 1 wherein the first elements storing charge include n-type regions of an n-channel transistor, and the second elements storing charge include p-type regions of a p-channel transistor.

3. The integrated circuit device of claim 2 wherein a source of the n-channel transistor is coupled to ground, a source of the p-channel transistor is coupled to a first reference voltage, and a drain of the n-channel transistor is coupled to a drain of the p-channel transistor.

4. The integrated circuit device of claim 1 wherein the p-tap includes a p-type region having a contact configured to receive the ground voltage or the negative voltage.

5. The integrated circuit device of claim 1 wherein the first positive voltage contact is configured to receive a first positive voltage and the second positive voltage contact is configured to receive a second positive voltage that is different than the first positive voltage.

6. The integrated circuit device of claim 5 wherein the first positive voltage is greater than the second positive voltage.

7. An integrated circuit device having improved radiation immunity, comprising:
   an n-type die from an n-type wafer having a first surface and a second surface, wherein the n-type die is coupled to a first positive voltage contact;
   a p-type epitaxial layer formed on the first surface of the n-type die, the p-type epitaxial layer having elements of an n-channel transistor and a p-tap, wherein the p-tap is coupled to a contact configured to receive a ground voltage or a negative voltage;
   an n-well formed in the p-type epitaxial layer, the n-well having elements of a p-channel transistor and an n-type region, wherein the n-channel transistor and the p-channel transistor are coupled to form a CMOS transistor pair; and
   a deep n-well contact coupled to the first surface of the n-type die;
   wherein the n-type die is coupled to the first positive voltage contact by way of the deep n-well contact;
   wherein the n-type region of the n-well is coupled to a second positive voltage contact; and
   wherein the n-well and the p-type epitaxial layer forms a first p-n junction to attract excess minority carriers in the p-type epitaxial layer, and the n-type die and the p-type epitaxial layer forms a second p-n junction to attract excess minority carriers in the p-type epitaxial layer.

8. The integrated circuit device of claim 7 wherein the p-tap comprises a p-type region in the p-type epitaxial layer.

9. The integrated circuit device of claim 7 wherein the first positive voltage contact is configured to receive a first positive voltage and the second positive voltage contact is configured to receive a second positive voltage that is different than the first positive voltage.

10. The integrated circuit device of claim 9 wherein the first positive voltage is greater than the second positive voltage.

11. A method of improving radiation immunity of an integrated circuit, the method comprising:
   forming a p-type epitaxial layer on a first surface of an n-type die from an n-type wafer, the p-type epitaxial layer having first elements storing charge and a p-tap, wherein the p-tap is coupled to a contact configured to receive a ground voltage or a negative voltage;
   forming an n-well formed in the p-type epitaxial layer, the n-well having second elements storing charge;
   forming an n-type region in the n-well;
   forming a deep n-well contact coupled to the first surface of the n-type die;

coupling the deep n-well contact to a first positive voltage contact configured to receive a positive voltage; and coupling the n-type region of the n-well to a second positive voltage contact configured to receive a positive voltage;

wherein the n-well and the p-type epitaxial layer form a first p-n junction to attract excess minority carriers in the p-type epitaxial layer, and the n-type die and the p-type epitaxial layer form a second p-n junction to attract excess minority carriers in the p-type epitaxial layer.

12. The method of claim 11 wherein the first positive voltage contact is configured to receive a first positive voltage and the second positive voltage contact is configured to receive a second positive voltage that is different than the first positive voltage.

13. The method of claim 12 wherein the first positive voltage is greater than the second positive voltage.

14. The method of claim 11 wherein forming the first elements storing charge and forming the second elements storing charge comprise forming a CMOS pair.

* * * * *